US008693963B2

(12) United States Patent
du Toit et al.

(10) Patent No.: US 8,693,963 B2
(45) Date of Patent: Apr. 8, 2014

(54) TUNABLE MICROWAVE DEVICES WITH AUTO-ADJUSTING MATCHING CIRCUIT

(71) Applicant: Research In Motion RF, Inc., Wilmington, DE (US)

(72) Inventors: Cornelis Frederik du Toit, Ellicott City, MD (US); Deirdre A Ryan, Poquoson, VA (US); Gregory Mendolia, Nashua, NH (US); James Martin, Londonderry, NH (US); Izz Khayo, Nashua, NH (US); Heinz Bachmann, Stow, MA (US); William E. McKinzie, Fulton, MD (US)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

(21) Appl. No.: 13/745,624

(22) Filed: Jan. 18, 2013

(65) Prior Publication Data

US 2013/0169493 A1 Jul. 4, 2013

Related U.S. Application Data

(60) Continuation of application No. 12/952,395, filed on Nov. 23, 2010, which is a continuation of application No. 11/245,898, filed on Oct. 8, 2005, now Pat. No. 7,865,154, which is a continuation-in-part of application No. 10/938,898, filed on Sep. 10, 2004, now abandoned, which is a continuation of application No. 10/455,901, filed on Jun. 6, 2003, now Pat. No. 6,864,757, which is a division of application No. 09/909,187, filed on Jul. 19, 2001, now Pat. No. 6,590,468.

(60) Provisional application No. 60/219,500, filed on Jul. 20, 2000.

(51) Int. Cl.
*H04B 1/04* (2006.01)

(52) U.S. Cl.
USPC .......................................... 455/125; 333/17.3

(58) Field of Classification Search
USPC .......... 455/91, 107, 115.1, 115.2, 115.3, 121, 455/123, 129, 232.1, 254, 125; 333/17, 32, 333/17.3; 343/860
See application file for complete search history.

(56) References Cited

U.S. PATENT DOCUMENTS 2,745,067 A 5/1956 True
3,117,279 A 1/1964 Ludvigson
(Continued)

FOREIGN PATENT DOCUMENTS

DE 19614655 10/1997
DE 102008050743 4/2010
(Continued)

OTHER PUBLICATIONS

Bezooijen, A. et al., "A GSM/EDGE/WCDMA Adaptive Series—LC Matching Network Using RF-MEMS Switches", IEEE Journal of Solid-State Circuits, vol. 43, No. 10, Oct. 2008, 2259-2268.

(Continued)

Primary Examiner — Thanh Le
(74) Attorney, Agent, or Firm — Guntin & Gust, PLC; Ed Guntin

(57) ABSTRACT

An embodiment of the present disclosure provides a variable impedance circuit including an antenna having a tunable component. The tunable component can be operable to receive a variable signal to cause the tunable component to change an impedance of the antenna. The tunable component can include a first conductor coupled to the antenna, a second conductor, and a tunable material positioned between the first conductor and the second conductor, where at least one of the first conductor or the second conductor, or both are adapted to receive the variable signal to cause the change in the impedance of the antenna. Additional embodiments are disclosed.

20 Claims, 6 Drawing Sheets

(56) References Cited

U.S. PATENT DOCUMENTS

| | | | |
|---|---|---|---|
| 3,160,832 A | 12/1964 | Beitman | |
| 3,390,337 A | 6/1968 | Beitman | |
| 3,443,231 A | 5/1969 | Roza | |
| 3,509,500 A | 4/1970 | McNair | |
| 3,571,716 A | 3/1971 | Hill | |
| 3,590,385 A | 6/1971 | Sabo | |
| 3,601,717 A | 8/1971 | Kuecken | |
| 3,742,279 A | 6/1973 | Kupsky | |
| 3,794,941 A | 2/1974 | Templin | |
| 3,919,644 A | 11/1975 | Smolka | |
| 3,990,024 A | 11/1976 | Hou | |
| 3,995,237 A | 11/1976 | Brunner | |
| 4,186,359 A | 1/1980 | Kaegebein | |
| 4,201,960 A | 5/1980 | Skutta | |
| 4,227,256 A | 10/1980 | O'Keefe | |
| 4,383,441 A | 5/1983 | Willis | |
| 4,476,578 A * | 10/1984 | Gaudin et al. | 455/129 |
| 4,493,112 A | 1/1985 | Bruene | |
| 4,777,490 A | 10/1988 | Sharma | |
| 4,799,066 A | 1/1989 | Deacon | |
| 4,965,607 A | 10/1990 | Wilkins | |
| 4,980,656 A | 12/1990 | Duffalo | |
| 5,032,805 A | 7/1991 | Elmer | |
| 5,136,478 A | 8/1992 | Bruder | |
| 5,142,255 A | 8/1992 | Chang | |
| 5,177,670 A | 1/1993 | Shinohara | |
| 5,195,045 A | 3/1993 | Keane | |
| 5,200,826 A | 4/1993 | Seong | |
| 5,212,463 A | 5/1993 | Babbitt | |
| 5,243,358 A | 9/1993 | Sanford | |
| 5,258,728 A | 11/1993 | Taniyoshi | |
| 5,276,912 A | 1/1994 | Siwiak | |
| 5,301,358 A | 4/1994 | Gaskill | |
| 5,307,033 A | 4/1994 | Koscica | |
| 5,310,358 A | 5/1994 | Johnson | |
| 5,312,790 A | 5/1994 | Sengupta | |
| 5,334,958 A | 8/1994 | Babbitt | |
| 5,371,473 A | 12/1994 | Trinh | |
| 5,409,889 A | 4/1995 | Das | |
| 5,427,988 A | 6/1995 | Sengupta | |
| 5,430,417 A | 7/1995 | Martin | |
| 5,446,447 A | 8/1995 | Carney | |
| 5,448,252 A | 9/1995 | Ali | |
| 5,451,567 A | 9/1995 | Das | |
| 5,451,914 A | 9/1995 | Stengel | |
| 5,457,394 A | 10/1995 | McEwan | |
| 5,472,935 A | 12/1995 | Yandrofski et al. | |
| 5,479,139 A | 12/1995 | Koscica et al. | |
| 5,486,491 A | 1/1996 | Sengupta et al. | |
| 5,496,795 A | 3/1996 | Das | |
| 5,502,372 A | 3/1996 | Quan | |
| 5,524,281 A | 6/1996 | Bradley et al. | |
| 5,548,837 A | 8/1996 | Hess et al. | |
| 5,561,407 A | 10/1996 | Koscica et al. | |
| 5,564,086 A | 10/1996 | Cygan et al. | |
| 5,589,844 A | 12/1996 | Belcher et al. | |
| 5,593,495 A | 1/1997 | Masuda et al. | |
| 5,635,433 A | 6/1997 | Sengupta | |
| 5,635,434 A | 6/1997 | Sengupta | |
| 5,640,042 A | 6/1997 | Koscica | |
| 5,679,624 A | 10/1997 | Das | |
| 5,689,219 A | 11/1997 | Piirainen | |
| 5,693,429 A | 12/1997 | Sengupta | |
| 5,694,134 A | 12/1997 | Barnes | |
| 5,699,071 A | 12/1997 | Urakami | |
| 5,721,194 A | 2/1998 | Yandrofski | |
| 5,766,697 A | 6/1998 | Sengupta et al. | |
| 5,777,581 A | 7/1998 | Lilly | |
| 5,778,308 A | 7/1998 | Sroka | |
| 5,786,727 A | 7/1998 | Sigmon | |
| 5,812,572 A | 9/1998 | King | |
| 5,812,943 A | 9/1998 | Suzuki | |
| 5,830,591 A | 11/1998 | Sengupta | |
| 5,846,893 A | 12/1998 | Sengupta | |
| 5,874,926 A * | 2/1999 | Tsuru et al. | 343/860 |
| 5,880,635 A | 3/1999 | Satoh | |
| 5,886,867 A | 3/1999 | Chivukula | |
| 5,892,482 A | 4/1999 | Coleman | |
| 5,929,717 A | 7/1999 | Richardson | |
| 5,963,871 A | 10/1999 | Zhinong | |
| 5,969,582 A | 10/1999 | Boesch | |
| 5,982,099 A | 11/1999 | Barnes et al. | |
| 5,990,766 A | 11/1999 | Zhang | |
| 6,009,124 A | 12/1999 | Smith | |
| 6,020,787 A | 2/2000 | Kim | |
| 6,020,795 A | 2/2000 | Kim | |
| 6,029,075 A | 2/2000 | Das | |
| 6,045,932 A | 4/2000 | Jia | |
| 6,061,025 A | 5/2000 | Jackson | |
| 6,074,971 A | 6/2000 | Chiu | |
| 6,096,127 A | 8/2000 | Dimos | |
| 6,100,733 A | 8/2000 | Dortu | |
| 6,101,102 A | 8/2000 | Brand | |
| 6,115,585 A | 9/2000 | Matero | |
| 6,133,883 A | 10/2000 | Munson | |
| 6,172,385 B1 | 1/2001 | Duncombe | |
| 6,215,644 B1 | 4/2001 | Dhuler | |
| 6,242,989 B1 | 6/2001 | Barber | |
| 6,281,748 B1 | 8/2001 | Klomsdorf et al. | |
| 6,281,847 B1 | 8/2001 | Lee | |
| 6,309,895 B1 | 10/2001 | Jaing | |
| 6,343,208 B1 | 1/2002 | Ying | |
| 6,377,142 B1 | 4/2002 | Chiu | |
| 6,377,217 B1 | 4/2002 | Zhu | |
| 6,377,440 B1 | 4/2002 | Zhu | |
| 6,384,785 B1 | 5/2002 | Kamogawa | |
| 6,404,614 B1 | 6/2002 | Zhu | |
| 6,408,190 B1 | 6/2002 | Ying | |
| 6,414,562 B1 | 7/2002 | Bouisse | |
| 6,415,562 B1 | 7/2002 | Donaghue | |
| 6,452,776 B1 | 9/2002 | Chakravorty | |
| 6,461,930 B2 | 10/2002 | Akram | |
| 6,466,774 B1 | 10/2002 | Okabe | |
| 6,492,883 B2 | 12/2002 | Liang | |
| 6,514,895 B1 | 2/2003 | Chiu | |
| 6,525,630 B1 | 2/2003 | Zhu | |
| 6,531,936 B1 | 3/2003 | Chiu | |
| 6,535,076 B2 | 3/2003 | Partridge | |
| 6,535,722 B1 | 3/2003 | Rosen | |
| 6,538,603 B1 | 3/2003 | Chen | |
| 6,556,102 B1 | 4/2003 | Sengupta | |
| 6,556,814 B1 | 4/2003 | Klomsdorf | |
| 6,570,462 B2 | 5/2003 | Edmonson | |
| 6,590,468 B2 | 7/2003 | du Toit | |
| 6,590,541 B1 | 7/2003 | Schultze | |
| 6,597,265 B2 | 7/2003 | Liang | |
| 6,608,603 B2 | 8/2003 | Alexopoulos | |
| 6,624,786 B2 | 9/2003 | Boyle | |
| 6,640,085 B1 | 10/2003 | Chatzipetros | |
| 6,657,595 B1 | 12/2003 | Alameh | |
| 6,661,638 B2 | 12/2003 | Terry | |
| 6,670,256 B2 | 12/2003 | Yang | |
| 6,710,651 B2 | 3/2004 | Forrester | |
| 6,724,611 B1 | 4/2004 | Mosley | |
| 6,724,890 B1 | 4/2004 | Bareis | |
| 6,737,179 B2 | 5/2004 | Sengupta | |
| 6,759,918 B2 | 7/2004 | Du Toit | |
| 6,765,540 B2 | 7/2004 | Toncich | |
| 6,768,472 B2 | 7/2004 | Alexopoulos | |
| 6,774,077 B2 | 8/2004 | Sengupta | |
| 6,795,712 B1 | 9/2004 | Vakilian | |
| 6,825,818 B2 | 11/2004 | Toncich | |
| 6,839,028 B2 | 1/2005 | Lee | |
| 6,845,126 B2 | 1/2005 | Dent | |
| 6,859,104 B2 | 2/2005 | Toncich | |
| 6,862,432 B1 | 3/2005 | Kim | |
| 6,864,757 B2 | 3/2005 | Du Toit | |
| 6,868,260 B2 | 3/2005 | Jagielski | |
| 6,875,655 B2 | 4/2005 | Lin | |
| 6,888,714 B2 | 5/2005 | Shaw | |
| 6,905,989 B2 | 6/2005 | Ellis | |
| 6,907,234 B2 | 6/2005 | Karr | |
| 6,920,315 B1 | 7/2005 | Wilcox et al. | |
| 6,922,330 B2 | 7/2005 | Nielsen | |

(56) References Cited

U.S. PATENT DOCUMENTS

| | | |
|---|---|---|
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent |
| 6,964,296 B2 | 11/2005 | Memory |
| 6,965,837 B2 | 11/2005 | Vintola |
| 6,993,297 B2 | 1/2006 | Smith |
| 6,999,297 B1 | 2/2006 | Klee |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | Du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,298,329 B2 | 11/2007 | Diament |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,369,828 B2 | 5/2008 | Shamsaifar |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 | 12/2008 | Tsai |
| 7,469,129 B2 | 12/2008 | Blaker et al. |
| 7,531,011 B2 | 5/2009 | Yamasaki |
| 7,535,080 B2 | 5/2009 | Zeng et al. |
| 7,535,312 B2 | 5/2009 | McKinzie |
| 7,539,527 B2 | 5/2009 | Jang |
| 7,557,507 B2 | 7/2009 | Wu |
| 7,596,357 B2 | 9/2009 | Nakamata |
| 7,633,355 B2 | 12/2009 | Matsuo |
| 7,655,530 B2 | 2/2010 | Hosking |
| 7,667,663 B2 | 2/2010 | Hsiao et al. |
| 7,705,692 B2 | 4/2010 | Fukamachi et al. |
| 7,711,337 B2 | 5/2010 | Mckinzie |
| 7,714,676 B2 | 5/2010 | McKinzie |
| 7,714,678 B2 | 5/2010 | du Toit |
| 7,728,693 B2 | 6/2010 | du Toit |
| 7,768,400 B2 | 8/2010 | Lawrence |
| 7,786,819 B2 | 8/2010 | Ella |
| 7,795,990 B2 | 9/2010 | du Toit |
| 7,852,170 B2 | 12/2010 | McKinzie |
| 7,865,154 B2 | 1/2011 | Mendolia |
| 7,907,094 B2 | 3/2011 | Kakitsu |
| 7,917,104 B2 | 3/2011 | Manssen |
| 7,949,309 B2 | 5/2011 | Rofougaran |
| 7,969,257 B2 | 6/2011 | du Toit |
| 7,991,363 B2 | 8/2011 | Greene |
| 8,008,982 B2 | 8/2011 | McKinzie |
| 8,072,285 B2 | 12/2011 | Spears |
| 8,112,043 B2 | 2/2012 | Knudsen |
| 8,170,510 B2 | 5/2012 | Knudsen et al. |
| 8,190,109 B2 | 5/2012 | Ali et al. |
| 8,204,446 B2 | 6/2012 | Scheer |
| 8,217,732 B2 | 7/2012 | McKinzie |
| 8,299,867 B2 | 10/2012 | Mckinzie |
| 8,320,850 B1 | 11/2012 | Khlat |
| 8,442,457 B2 | 5/2013 | Harel et al. |
| 2002/0008672 A1 | 1/2002 | Gothard |
| 2002/0030566 A1 | 3/2002 | Bozler |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0187780 A1 | 12/2002 | Souissi |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0142022 A1 | 7/2003 | Ollikainen |
| 2003/0193997 A1 | 10/2003 | Dent |
| 2003/0199286 A1 | 10/2003 | D du Toit |
| 2003/0210206 A1 | 11/2003 | Phillips |
| 2003/0232607 A1 | 12/2003 | Le Bars |
| 2004/0009754 A1 | 1/2004 | Smith |
| 2004/0090372 A1 | 5/2004 | Nallo |
| 2004/0100341 A1 | 5/2004 | Luetzelschwab |
| 2004/0127178 A1 | 7/2004 | Kuffner |
| 2004/0137950 A1 | 7/2004 | Bolin |
| 2004/0202399 A1 | 10/2004 | Kochergin |
| 2004/0257293 A1 | 12/2004 | Friedrich |
| 2005/0007291 A1 | 1/2005 | Fabrega-Sanchez |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo |
| 2005/0082636 A1 | 4/2005 | Yashima |
| 2005/0085204 A1 | 4/2005 | Poilasne |
| 2005/0093624 A1 | 5/2005 | Forrester et al. |
| 2005/0130608 A1 | 6/2005 | Forse |
| 2005/0130699 A1 | 6/2005 | Kim |
| 2005/0208960 A1 | 9/2005 | Hassan |
| 2005/0215204 A1 | 9/2005 | Wallace |
| 2005/0264455 A1 | 12/2005 | Talvitie |
| 2005/0282503 A1 | 12/2005 | Onno |
| 2006/0003537 A1 | 1/2006 | Sinha |
| 2006/0009165 A1 | 1/2006 | Alles |
| 2006/0099915 A1 | 5/2006 | Laroia et al. |
| 2006/0160501 A1 | 7/2006 | Mendolia |
| 2006/0183433 A1 | 8/2006 | Mori et al. |
| 2006/0183442 A1 | 8/2006 | Chang et al. |
| 2006/0205368 A1 | 9/2006 | Bustamante |
| 2006/0281423 A1 | 12/2006 | Caimi |
| 2007/0013483 A1 | 1/2007 | Stewart |
| 2007/0035458 A1 | 2/2007 | Ohba |
| 2007/0042725 A1 | 2/2007 | Poilasne |
| 2007/0042734 A1 | 2/2007 | Ryu |
| 2007/0063788 A1 | 3/2007 | Zhu |
| 2007/0080888 A1 | 4/2007 | Mohamadi |
| 2007/0082611 A1 | 4/2007 | Terranova et al. |
| 2007/0085609 A1 | 4/2007 | Itkin |
| 2007/0111681 A1 | 5/2007 | Alberth et al. |
| 2007/0142014 A1 | 6/2007 | Wilcox |
| 2007/0149146 A1 | 6/2007 | Hwang |
| 2007/0182636 A1 | 8/2007 | Carlson |
| 2007/0184825 A1 | 8/2007 | Lim |
| 2007/0194859 A1 | 8/2007 | Brobston |
| 2007/0197180 A1 | 8/2007 | McKinzie |
| 2007/0200766 A1 | 8/2007 | McKinzie |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0055016 A1 | 3/2008 | Morris |
| 2008/0081670 A1 | 4/2008 | Rofougaran |
| 2008/0106350 A1 | 5/2008 | McKinzie |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0261544 A1 | 10/2008 | Blin |
| 2008/0274706 A1 | 11/2008 | Blin |
| 2008/0280570 A1 | 11/2008 | Blin |
| 2008/0300027 A1 | 12/2008 | Dou |
| 2008/0305749 A1 | 12/2008 | Ben-Bassat |
| 2009/0002077 A1 | 1/2009 | Rohani et al. |
| 2009/0027286 A1 | 1/2009 | Ohishi |
| 2009/0082017 A1 | 3/2009 | Chang et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0184879 A1 | 7/2009 | Derneryd |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |

(56) References Cited

U.S. PATENT DOCUMENTS

| | | |
|---|---|---|
| 2009/0323582 A1 | 12/2009 | Proctor |
| 2010/0041348 A1 | 2/2010 | Wilcox |
| 2010/0053009 A1 | 3/2010 | Rofougaran |
| 2010/0073103 A1 | 3/2010 | Spears |
| 2010/0085260 A1 | 4/2010 | Mckinzie |
| 2010/0105425 A1 | 4/2010 | Asokan |
| 2010/0156552 A1 | 6/2010 | McKinzie |
| 2010/0164640 A1 | 7/2010 | Mckinzie |
| 2010/0164641 A1 | 7/2010 | Mckinzie |
| 2010/0232474 A1 | 9/2010 | Rofougaran |
| 2010/0285836 A1 | 11/2010 | Horihata |
| 2010/0302106 A1 | 12/2010 | Knudsen |
| 2010/0304688 A1 | 12/2010 | Knudsen |
| 2011/0012790 A1 | 1/2011 | Badaruzzaman |
| 2011/0014879 A1 | 1/2011 | Alberth et al. |
| 2011/0014886 A1 | 1/2011 | Manssen |
| 2011/0043298 A1 | 2/2011 | McKinzie |
| 2011/0053524 A1 | 3/2011 | Manssen |
| 2011/0063042 A1 | 3/2011 | Mendolia |
| 2011/0086600 A1 | 4/2011 | Muhammad |
| 2011/0086630 A1 | 4/2011 | Manssen |
| 2011/0102290 A1 | 5/2011 | Milosavljevic |
| 2011/0105023 A1 | 5/2011 | Scheer et al. |
| 2011/0121079 A1 | 5/2011 | Lawrence et al. |
| 2011/0133994 A1 | 6/2011 | Korva |
| 2011/0183628 A1 | 7/2011 | Baker |
| 2011/0183633 A1 | 7/2011 | Ohba |
| 2011/0227666 A1 | 9/2011 | Manssen |
| 2011/0250852 A1 | 10/2011 | Greene |
| 2011/0254637 A1 | 10/2011 | Manssen |
| 2011/0254638 A1 | 10/2011 | Manssen |
| 2011/0256857 A1 | 10/2011 | Chen et al. |
| 2011/0281532 A1 | 11/2011 | Shin |
| 2011/0299438 A1 | 12/2011 | Mikhemar |
| 2012/0075159 A1 | 3/2012 | Chang |
| 2012/0094708 A1 | 4/2012 | Park |
| 2012/0100802 A1 | 4/2012 | Mohebbi |
| 2012/0154975 A1 | 6/2012 | Oakes |
| 2012/0214421 A1 | 8/2012 | Hoirup |
| 2012/0243579 A1 | 9/2012 | Premakanthan et al. |
| 2012/0295554 A1 | 11/2012 | Greene |

FOREIGN PATENT DOCUMENTS

| | | |
|---|---|---|
| EP | 0685936 | 6/1995 |
| EP | 0909024 | 4/1999 |
| EP | 1079296 | 2/2001 |
| EP | 1137192 | 9/2001 |
| EP | 1298810 | 4/2006 |
| EP | 2328233 | 6/2011 |
| JP | 03276901 | 3/1990 |
| JP | 9321526 | 12/1997 |
| JP | 10209722 | 8/1998 |
| JP | 2000124066 | 4/2000 |
| KR | 100645526 | 11/2006 |
| KR | 10-0740177 | 7/2007 |
| WO | 01/71846 | 9/2001 |
| WO | 2006/031170 | 3/2006 |
| WO | 2008/030165 | 3/2008 |
| WO | 2009/064968 | 5/2009 |
| WO | 2009/155966 | 12/2009 |
| WO | 2011/044592 | 4/2011 |
| WO | 2011/084716 | 7/2011 |
| WO | 2011/133657 | 10/2011 |
| WO | 2011028453 | 10/2011 |
| WO | 2012/085932 | 6/2012 |

OTHER PUBLICATIONS

Du Toit, , "Tunable Microwave Devices With Auto Adjusting Matching Circuit", U.S. Appl. No. 13/302,617, filed Nov. 22, 2011.
Du Toit, , "Tunable Microwave Devices With Auto-Adjusting Matching Circuit", U.S. Appl. No. 13/302,649, filed Nov. 22, 2011.
Eiji, N. , "High-Frequency Circuit and Its Manufacture", Patent Abstracts of Japan, vol. 1998, No. 13, Nov. 30, 1998 & JP 10 209722 A (Seiko Epson Corp), Aug. 7, 1998.
Greene, , "Method and Apparatus for Tuning a Communication Device", U.S. Appl. No. 13/108,463, filed May 16, 2011.
Greene, , "Method and Apparatus for Tuning a Communication Device", U.S. Appl. No. 13/108,589, filed May 16, 2011.
Hoirup, , "Method and Apparatus for Radio Antenna Frequency Tuning", U.S. Appl. No. 13/030,177, filed Feb. 18, 2011.
Huang, Libo et al., "Theoretical and experimental investigation of adaptive antenna impedance matching for multiband mobile phone applications", IEEE, Sep. 7, 2005, 13-17.
Hyun, S. , "Effects of strain on the dielectric properties of tunable dielectric SrTi03 thin films", Applied Physics Letters, vol. 79, No. 2, Jul. 9, 2001.
Ida, I. et al., "An Adaptive Impedence Matching System and Its Application to Mobile Antennas", TENCON 2004, IEEE Region 10 Conference, See Abstract ad p. 544, Nov. 21-24, 2004, 543-547.
Katsuya, K. , "Hybrid Integrated Circuit Device", Patent Abstracts of Japan, Publication No. 03-276901, Date of publication of application: Sep. 12, 1991.
Manssen, , "Method and Apparatus for Managing Interference in a Communication Device", U.S. Appl. No. 61/326,206, filed Apr. 20, 2010.
Manssen, , "Method and Apparatus for Tuning Antennas in a Communication Device", U.S. Appl. No. 12/941,972, filed Nov. 8, 2010.
Manssen, , "Method and Apparatus for Tuning Antennas in a Communication Device", U.S. Appl. No. 13/005,122, filed Jan. 12, 2011.
McKinzie, , "Adaptive Impedance Matching Module (AIMM) Control Architectures", U.S. Appl. No. 13/293,544, filed Nov. 10, 2011.
McKinzie, , "Adaptive Impedance Matching Module (AIMM) Control Architectures", U.S. Appl. No. 13/293,550, filed Nov. 10, 2011.
McKinzie, , "Method and Apparatus for Adaptive Impedance Matching", U.S. Appl. No. 13/217,748, filed Aug. 25, 2011.
Mendolia, , "Method and Apparatus for Tuning a Communication Device", U.S. Appl. No. 13/035,417, filed Feb. 25, 2011.
Paratek Microwave, Inc., , "Method and Appartus for Tuning Antennas in a Communication Device", International Application No. PCT/US11/59620; Filed Nov. 7, 2011.
Patent Cooperation Treaty, , "International Search Report and Written Opinion", International Application No. PCT/US2010/046241, Mar. 2, 2011.
Patent Cooperation Treaty, , "International Search Report and Written Opinion", International Application No. PCT/US2010/056413, Jul. 27, 2011.
Patent Cooperation Treaty, , "International Search Report and Written Opinion", Nov. 16, 2011, International Application No. PCT/US/2011/038543.
Patent Cooperation Treaty, , "International Search Report and Written Opinion", PCT Application No. PCT/US08/005085, Jul. 2, 2008.
Pervez, N.K. , "High Tunability barium strontium titanate thin films for RF circuit applications", Applied Physics Letters, vol. 85, No. 19, Nov. 8, 2004.
Petit, Laurent , "MEMS-Switched Parasitic-Antenna Array for Radiation Pattern Diversity", IEEE Transactions on Antennas and Propagation, vol. 54, No. 9, Sep. 2009, 2624-2631.
Qiao, et al., "Antenna Impedance Mismatch Measurement and Correction for Adaptive COMA Transceivers", IEEE, Jan. 2005.
Qiao, et al., "Measurement of Antenna Load Impedance for Power Amplifiers", The Department of Electrical and Computer Engineering, University of California, San Diego, Sep. 13, 2004.
Spears, , "Methods for Tuning an Adaptive Impedance Matching Network With a Look-Up Table", U.S. Appl. No. 13/297,951, filed Nov. 16, 2011.
Stemmer, Susanne , "Low-loss tunable capacitors fabricated directly on gold bottom electrodes", Applied Physics Letters 88, 112905, Mar. 15, 2006.
Taylor, T.R. , "Impact of thermal strain on the dielectric constant of sputtered barium strontium titanate thin films", Applied Physics Letters, vol. 80, No. 11, Mar. 18, 2002.

(56) References Cited

OTHER PUBLICATIONS

Tombak, Ali, "Tunable Barium Strontium Titanate Thin Film Capacitors for RF and Microwave Applications", IEEE Microwave and Wireles Components Letters, vol. 12, Jan. 2002.

Xu, Hongtao, "Tunable Microwave Integrated Circuits using BST Thin Film Capacitors with Device", Integrated Ferroelectrics, Department of Electrical Engineering and Computer Engineering, University of California, Apr. 2005.

Zuo, S., "Eigenmode Decoupling for Mimo Loop-Antenna Based on 180 Coupler", Progress in Electromagnetics Research Letters, vol. 26, Aug. 2011, 11-20.

* cited by examiner

TUNABLE MICROWAVE DEVICES WITH AUTO-ADJUSTING MATCHING CIRCUIT

CROSS REFERENCED TO RELATED APPLICATIONS

This application is a continuation of application Ser. No. 12/952,395, entitled TUNABLE MICROWAVE DEVICES WITH AUTO-ADJUSTING MATCHING CIRCUIT, filed Nov. 23, 2010, which is a continuation of application Ser. No. 11/245,898, now U.S. Pat. No. 7,865,154, entitled TUNABLE MICROWAVE DEVICES WITH AUTO-ADJUSTING MATCHING CIRCUIT, filed Oct. 8, 2005, which is a continuation in part of application Ser. No. 10/938,898 entitled "TUNABLE MICROWAVE DEVICES WITH AUTO-ADJUSTING MATCHING CIRCUIT", filed Sep. 10, 2004, which is a continuation of application Ser. No. 10/455,901, now U.S. Pat. No. 6,864,757, entitled "TUNABLE MICROWAVE DEVICES WITH AUTO-ADJUSTING MATCHING CIRCUIT", filed Jun. 6, 2003, which is a divisional of application Ser. No. 09/909,187, now U.S. Pat. No. 6,590,468, entitled "TUNABLE MICROWAVE DEVICES WITH AUTO-ADJUSTING MATCHING CIRCUIT", filed Jul. 19, 2001, which claims the benefit of U.S. provisional application No. 60/219,500, filed Jul. 20, 2000. All sections of application Ser. No. 12/952,395, and U.S. Pat. No. 7,865,154 are incorporated herein by reference in their entirety.

BACKGROUND

Wireless communications is a rapidly growing segment of the communications industry, with the potential to provide high-speed high-quality information exchange between portable devices located anywhere in the world. Potential applications enabled by this technology include, but are not limited to, multimedia Internet-enabled cell phones, smart homes and appliances, automated highway systems, video teleconferencing and distance learning, and autonomous sensor networks, to name just a few. However, supporting these applications using wireless techniques poses a significant technical challenge.

Presently, mobile phones employing the Global System for Mobile Communication ("IGSM") standard operate in multiple frequency bands. Mobile phones may be capable of three or four frequency bands, thereby allowing the mobile phone to be used with a variety of service providers. However, the speed and quality of GSM will not meet the requirements of the large data transmission of the future.

GPRS (General Packet Radio Services) is a packet-based wireless that promises data rates from 56 up to 114 Kbps and continuous connection to the Internet for mobile phone and computer users. GPRS is based on "regular" GSM (with the same modulation) and will complement existing services such circuit-switched cellular phone connections such as SMS or cell broadcast. Voice over IP over GPRS has also been explored.

Similarly, Enhanced Data rate for Global Evolution (EDGE) is a radio based high-speed mobile data standard. It allows data transmission speeds of 384 kbps to be achieved when all eight timeslots are used. This means a maximum bit rate of 48 kbps per timeslot. Even higher speeds and bandwidths are now available as WCDMA (Wideband Code Division Multiple Access) is implemented.

As handsets move to meet increased bandwidth needs, the requirements of components are more astringent. Battery life has to be maximized, reception clarity in a multitude of environments has to be improved and at the same time the customers require a significant reduction in size. These requirements burden the Radio Frequency (RF) front end modules (FEM) to be capable of modulating efficiently and dynamically between the leading global wireless broadband standards in a single platform solution.

I. Impedance Match

In order to maximize battery life, energy transfer received by RF (inputs and outputs) must be perfectly matched to the impedance of the antennas. This impedance is typically assumed to be 50 ohms. For no mismatch losses to occur, the impedance of the radio must be the "conjugate match" of the impedance of the antenna. That is, the impedances must have the exact same value of real impedance (resistive part) and opposite but equal value of imaginary impedances (reactive part). For example, if the radio impedance is 40+j6, the antenna impedance must be 40−j6 in order to have no power lost due to impedance mismatch.

However, this 50 ohm design target is never perfectly met and also an antenna's impedance is never consistently 50 ohms over all conditions and frequencies of operation. The greater the difference in impedance, the less power reaches the antenna and radiates. Instead, a portion of this power (proportional to the impedance mismatch) is reflected back towards the radio during transmission and never gets radiated out of the antenna as intended. Given the reciprocal nature of most radios with antennas, this mismatch reduces the amount of power received by the radio from the antenna during reception. Because the mobile phone is operated in various environments, the antenna is "detuned", resulting in impedance at its I/O port which can vary wildly. Similarly, unit-to-unit variations in performance can be seen in power amplifiers, filters, switches and antennas when produced in high volume. Regardless of why the two impedances may not be matched, the greater the difference, the greater the power level reflected and the lower the power transferred (transmitted or received), thus lowering the overall efficiency of the RF system (antenna+radio). Also, antennas often compromise bandwidth in exchange for greater gain (efficiency) or reduced size. This results in greater variation of its impedance over the frequency of operation.

II The Voltage Standing Wave Ratio (VSWR)

The voltage standing wave ratio is a measure of how well a load is impedance-matched to a source. The value of VSWR is always expressed as a ratio with 1 in the denominator (2:1, 3:1, 10:1, etc.). It is a scalar measurement, so although they reflect waves 15 oppositely, a short circuit and an open circuit have the same VSWR value (infinity:1). A perfect impedance match corresponds to a VSWR 1:1, but in practice it will never be achieved. The reflection coefficient can be read from a Smith chart. A reflection coefficient magnitude of zero is a perfect match; a value of one is perfect reflection. The return loss of a load is merely the magnitude of the reflection coefficient expressed in decibels.

III Existing Methodologies

A. Fixed Impedance Networks.

With a fixed matching network, an amplifier which had been tuned for peak efficiency at the maximum output power level will show severely degraded efficiency as the gain is lowered and the output power drops. Standard matching networks present fixed impedance transformations at a given frequency. This limits the efficient operating range of an amplifier to 5 a narrow range of frequencies and a small range of power and bias settings.

B. Digital Matching Networks

Digital impedance matching using hybrid transformers, discrete OpAmp circuits, integrated analog/digital implementations are used to synthesize the matching impedance. Digital implementations of impedance matching networks are problematic due to the delays through the digital processors. These delays cause a phase difference between the incident and synthesized signals which results in an amplitude difference that worsens the return loss. This problem is generally alleviated by using a faster, but more costly and higher power consuming digital converter and processor.

C. Adaptive or Variable Matching Networks

It is possible to provide an adaptive antenna matching network which compensates for these variations. Several advantages offered by tunable matching networks, including optimization of amplifier match at varying frequency and against variable load VSWR. As the output power is reduced in a variable gain amplifier, the load impedance which allows the amplifier to operate with optimum efficiency changes. A system monitors the signal strength of an incoming signal, to provide indication of signal strength. This signal strength level is also used to adapt an adaptive network arranged to compensate for variations in antenna impedance. A problem with the above method is that adaptations of the antenna matching network may be effected in response to reductions in signal strength, when said reductions occur due to reasons other than antenna mismatch; for example, when the variations are due to mismatch in several mobile standards such as switching from GSM mode to EDGE mode. Therefore, adaptations do not improve transmission characteristics and at worst may make the transmission characteristics worse.

In variable impedance matching networks, the impedance can be adjusted to allow optimum efficiency at both low and high power settings. Output matching networks consisting of lumped capacitors (standard ceramic or tantalum capacitors), varactors, inductors, transmission lines, or transformers, suffer because the loss associated with the individual components. At the RF frequencies the more components used in the network, the aggregate of the individual component loss will worsen the total loss of the matching network.

D. Tunable Capacitors

High performance tunable capacitors are frequently used to tune variable impedance matching networks for RF communication applications. Typical capacitance values for these applications range from 1 pF to 5 pF with a tuning range of approximately 20% for Voltage Controlled Oscillators (VCOs) and 100% for antennas and filters. High quality factors 20 (Qs) over 50 are critical for these high performance tuning applications. A large voltage swing capability is highly desirable for implementing transmitter building blocks, where an RF voltage amplitude can reach 20 V peak to peak for an output power of 1 W.

Conventional tunable capacitors, commonly referred to as varactor diodes, are implemented using silicon PN junctions and Metal Oxide Semiconductor (MOS) capacitor structures. These devices suffer from a limited qualify factor and tuning range, and exhibit a low voltage swing capability limited by the forward biasing of PN junctions or silicon dioxide breakdown, thus inadequate for high performance RF applications. The most commonly used varactor is a semiconductor diode varactor. However, semiconductor diode varactors suffer from low Q factors (especially at high frequencies), low power handling, and high intermodulation distortion. Common varactors used today are silicon and gallium arsenide based diodes.

Micromachined tunable capacitors have been proposed to improve various aspects of the device performance. Aluminum micromechanical tunable capacitors have been demonstrated by vertically moving a suspended plate towards the substrate with an electrostatic force. The device achieves a high Q due to low resistive loss and a moderate tuning range adequate for low phase noise RF VCOs.

Copper-based micromachined tunable capacitors, relying on laterally actuating a dielectric slab between two sets of copper electrodes, have been developed to obtain an improved quality factor but suffer from a small tuning range due to the dielectric layer warpage caused by the film strain gradient.

Silicon-based micromachined tunable capacitors have also been investigated, including vertically actuating a movable plate between two fixed electrodes and laterally varying the overlap area between two sets of comb drive fingers to achieve a large tuning range around 100% with a 5 V tuning voltage. However, due to the excessive silicon resistive loss, the devices exhibit low quality factors at high frequencies.

Recently, micromachined tunable capacitors operating in dielectric fluid have also been demonstrated to achieve an increased capacitance density with improved tuning performance. However, besides the low quality factor caused by the large silicon resistive loss, complex fluidic packaging is required not suitable for mobile applications.

Ferroelectric materials can also be used to create matching networks for fixed as well as variable impedance matching applications. The dielectric constant of the ferroelectric material can be varied by a DC voltage applied across the ferroelectric. Because the dielectric constant of the ferroelectric material changes over time due to several factors including temperature, humidity, aging of the material and hysteresis, it has to be well known before and calibrated during the fabrication process. The degree to which temperature, humidity, aging, hysteresis and the like cause the value of the dielectric constant to vary over time depends on the particular material. Ferroelectric materials are available which demonstrate minimal dielectric constant variations as a result of these factors. However, such materials have the undesirable properties of low phase change with voltage which is the main parameter of interest between the conductor line and the ground plane.

Recent advances in tunable ferroelectric materials have allowed for relatively low capacitance varactors that can operate at temperatures above those necessary for superconduction and at bias voltages less than those required for existing planar varactor structures, while maintaining high tunability and high Q factors. Even though these materials work in their paraelectric phase above the Curie temperature, they are conveniently called "ferroelectric" because they exhibit spontaneous polarization at temperatures below the Curie temperature. Tunable ferroelectric materials including barium-strontium titanate $Ba_xSr_{1-x}TiO_3$ CBST) or BST composites have been the subject of several patents. Dielectric materials including BST are disclosed by Sengupta, et al. in U.S. Pat. No. 5,312,790; U.S. Pat. No. 5,427,988; U.S. Pat. No. 5,486,491; U.S. Pat. No. 5,846,893; U.S. Pat. No. 5,635,434; U.S. Pat. No. 5,830,591; U.S. Pat. No. 5,766,697; U.S. Pat. No. 5,693,429; U.S. Pat. No. 6,074,971; U.S. Pat. No. 6,801,104 B2 and U.S. Pat. No. 5,635,433. These patents are hereby incorporated by reference. The permittivity (more commonly called dielectric constant) of these materials can be varied by varying the strength of an electric field to which the materials are subjected. These materials allow for thin-film ferroelectric composites of low overall dielectric constant that takes advantage of the high tunability and at the same time having high dielectric constants.

Embedded mobile phone antennas have significant performance issues such as dramatic drop in efficiencies when operating conditions change from free space (in a hands-free cradle) to in-situ (against head/hand), with typical efficiencies going from 70% to 25% for the high bands and from 50% dropping down to 10% for the low bands. Also antenna bandwidths often compromises band-edge performance, especially for antennas having aggressive size reduction, the laws of physics limits gain bandwidth product possible for a given antenna volume.

For the foregoing reasons, there is a need in the RF industry to develop a self-contained dynamic, tunable (variable) matching antenna network for improved efficiency in the "de-tuned" state of components, with minimal mismatch loss in multi-mode operation. To match dynamically multiple power levels, temperature changes, aging of components in RF circuits. A matching antenna network compliant to many different high efficiency power amplifier front end modules (FEMs), for multiple protocols in a multi-mode/multi band/multi-frequency devices.

SUMMARY OF THE INVENTION

An embodiment of the present invention provides an apparatus, comprising an input port and a dynamic impedance matching network capable of determining a mismatch at the input port and dynamically changing the RF match by using at least one matching element that includes at least one voltage tunable dielectric capacitor. The matching network may be a "Pi", a "T", or "ladder" type network and the apparatus may further comprise at least one directional coupler capable of signal collection by sampling a portion of an incident signal, a reflected signal or both. In an embodiment of the present invention, the apparatus may also include a control and power control & logic unit (PC LU) to convert input analog signals into digital signals and sensing VSWR phase and magnitude and processing the digital signals using an algorithm to give it a voltage value and wherein the voltage values may be compared to values coming from the coupler and once compared and matched, the values may be passed to a Hi Voltage Application Specific Integrated Circuit (HV ASIC) to transfer and distribute compensatory voltages to the matching network elements.

In an embodiment of the present invention the sampling may be accomplished by at least one low impedance capacitor sampling element and the sampling element may be an interdigital capacitor or metal-insulator-metal (MIM) capacitor.

In an embodiment of the present invention, the aforementioned "ladder" type network may comprise four inductors in series and may include three grounded matching capacitors in parallel connected to the inductors.

In an embodiment of the present invention, the dynamic impedance matching network may be mounted onto a low-cost thermally conductive dielectric substrate with components surface mounted on one side, then over-molded as a Multi-Chip-Module (MCM), which may be itself surface mountable on to a printed wiring board of an RF devise. Further, the dynamic impedance matching network system may be positioned between a Power Amplifier (P A) unit and a frequency filter unit in the apparatus and the apparatus may be a mobile phone and further comprises an external digital signal processor to convert input analog signals into digital signals and sensing VSWR phase and magnitude and processing the digital signals using an algorithm to give it a voltage value and wherein the voltage values are compared to values coming from the coupler and once compared and matched, compensatory voltages are transferred and distributed to the matching network elements.

In an embodiment of the present invention, the apparatus may be a mobile phone and the dynamic impedance matching network system may be positioned between a frequency filter unit and a switch unit in the mobile phone or the dynamic impedance matching network may be a single stand-alone component that may be placed in the transmit chain of a mobile phone radio. Also, the apparatus may be a mobile phone and the dynamic impedance matching network may be self-contained thereby requiring only a fixed DC bias 3V from the mobile phone. This self-contained dynamic impedance matching network system enables impedance matching and therefore operation in a GSM, EDGE, CDMA or WCDMA or multi-mode mobile phone, and at least capable of a single band operation that includes 800, 900, 1800, 1900 MHz bands and the 2.1 GHz band.

In another embodiment of the present invention is provided a method of matching the impedance of an RF signal received by an input port of a device by using a dynamic impedance matching network capable of determining a mismatch at the input port and dynamically changing the RF match by using at least one matching element that includes at least one voltage tunable dielectric capacitor.

In yet another embodiment of the present invention is provided an auto-adjusting matching circuit, comprising a first and second coupler to sample an incoming signal and an outgoing signal, a matching network to receive the incoming signal and including a plurality of matching network elements comprising voltage tunable dielectric capacitors, wherein the matching network is capable of automatically adjusting an impedance of the incoming signal, and a power control & logic unit to produce a voltage to output ports from a High Voltage Application Specific Integrated Circuit to the plurality of matching network elements.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 1:
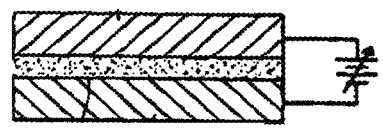
FIG. 1 illustrates a variable matching capacitor that may be used in an embodiment of the present invention.
Figure 2:
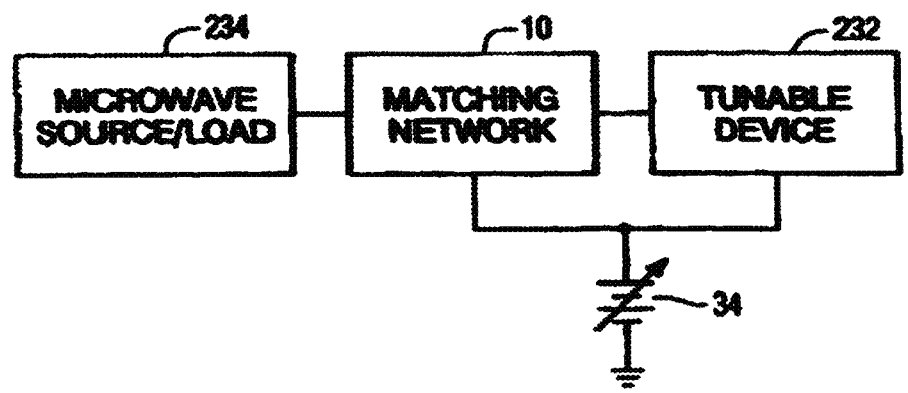
FIG. 2 provides a block representation of on embodiment of the present invention.

An impedance matching network or circuit, may be a combination of reactive elements connected between a circuit and at least one load that transform the load impedance into another impedance value to achieve improved performance such as maximum power transfer, reduced reflections, or optimum load performance. An impedance matching network may be made up of a combination of lumped elements, (resistors, capacitors, and inductors), or distributed elements (transmission lines of varying characteristic impedance and length). Similarly, an impedance matching network, transforms the circuit impedance from one value to another. A varactor of one embodiment of the present invention that may be used in an impedance matching network is illustrated in FIG. 1, with FIG. 2 depicting a block diagram showing a matching network 10 constructed in accordance with an embodiment of the present invention coupled to a tunable microwave device 232. The tunable device 232 could be one of many devices which have varying input/output characteristic impedances such as tunable phase shifters, delay lines, filters, etc. In the arrangement shown in FIG. 2, the adjustable external DC voltage source is used to supply bias voltage to the matching network 10 and the tunable microwave device 232 in tandem. As the voltage supplied by the external DC voltage source changes, the characteristic input/output impedance of the tunable dielectric device will also change. At the same time the impedance characteristics of the matching network will change to maximize power transfer from/to the microwave source/load 234 to/from the tunable microwave device 232. Alternatively, the tunable microwave device 232 and the matching network 10 can be controlled by two different external DV voltage sources 34.

Figure 7:
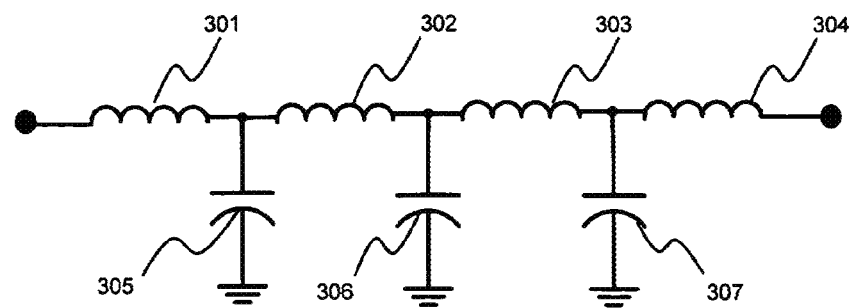
FIG. 7 is a schematical representation of a "Ladder" network comprising three "T" networks for use as the means for the matching network or as replacement for the matching network elements of one embodiment of the present invention.
Figure 8:
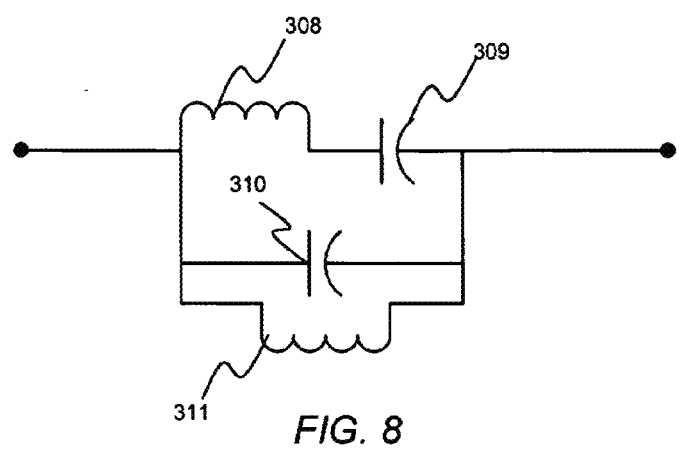
FIG. 8 is a schematical representation of a network for use as the means for the matching network or as replacement for the matching network elements of one embodiment of the present invention.
Figure 9:
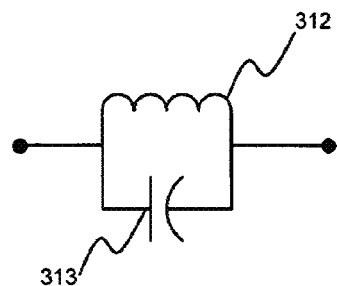
FIG. 9 is a schematical representation of a network for the use as the means for the matching network or as replacement for the matching network elements with an inductor in parallel to a matching capacitor in an embodiment of the present invention.

It may be determined, based on required source and load reflection coefficients, the ideal matching network required for a particular circuit. Depending on the center frequency, the proper individual values of the lumped elements or lengths of the transmission lines will be applied. In general, there are several different matching circuits available. Based on insertion loss, simplicity, and reproducibility of each matching element, the best selection can be made. Some of the possible networks typically used are described but not limited to FIG. 7, FIG. 8 and FIG. 9. For instance, many matching circuits may use shunt capacitors (parallel plate) or shunt inductors (spiral inductors), and appreciable voltage exists across the shunted component, their main reason is to provide a fixed voltage increase or to improve the power factor in the circuit. For example, on the input to a low noise transistor, the impedance of an incoming 75 ohm transmission line would be transformed by the input matching network to the impedance Zopt, required to achieve the minimum noise figure of the transistor. The Smith chart is a tool commonly used by microwave engineers to aid with impedance matching.

Figure 3:
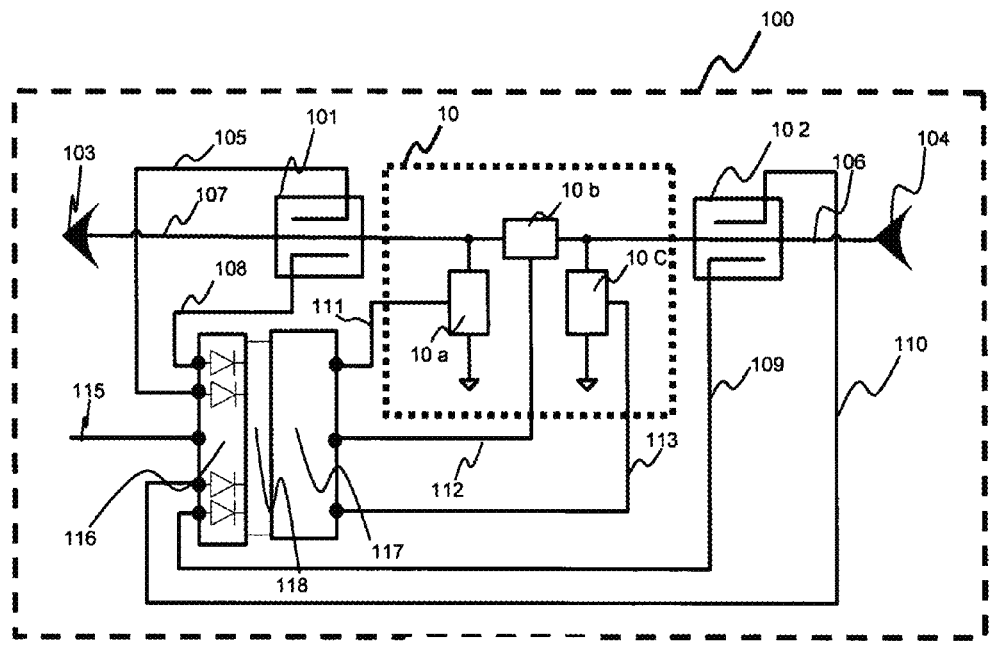
FIG. 3 is a schematical representation of one embodiment of the present invention illustrating the use of a "Pi" network as the means for the matching network.
Figure 10:
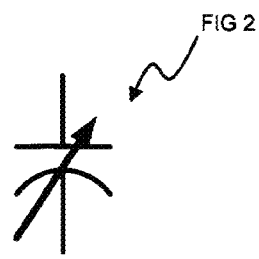
FIG. 10 is a schematical representation of a variable matching capacitor capable of being used as the means for the matching network elements and as replacement for any of the matching capacitors of one embodiment of the present invention.

Turning now to FIG. 3 is illustrated a dynamic impedance matching network system 100 that is composed of a "Pi" network as the means for the matching network 10. The "Pi" type network comprises matching network elements 10a, 10b, 10c in which in an embodiment of the present invention may be of the BST type variable matching capacitors 313 of FIG. 10.

Throughout the description of the present invention, BST may or has been used as a tunable dielectric material that may be used in a tunable dielectric capacitor of the present invention. However, the assignee of the present invention, Paratek Microwave, Inc. has developed and continues to develop tunable dielectric materials that may be utilized in embodiments of the present invention and thus the present invention is not limited to using BST material. This family of tunable dielectric materials may be referred to as Parascan®.

The term Parascan® as used herein is a trademarked term indicating a tunable dielectric material developed by the assignee of the present invention. Parascan® tunable dielectric materials have been described in several patents. Barium strontium titanate (BaTiO3-SrTiO3), also referred to as BSTO, is used for its high dielectric constant (200-6,000) and large change in dielectric constant with applied voltage (25-75 percent with a field of 2 Volts/micron). Tunable dielectric materials including barium strontium titanate are disclosed in U.S. Pat. No. 5,312,790 to Sengupta, et al. entitled "Ceramic Ferroelectric Material"; U.S. Pat. No. 5,427,988 by Sengupta, et al. entitled "Ceramic Ferroelectric Composite Material-BSTO-MgO"; U.S. Pat. No. 5,486,491 to Sengupta, et al. entitled "Ceramic Ferroelectric Composite Material-BSTO-ZrO2"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO-ZnO"; U.S. Pat. No. 6,074,971 by Chiu et al. entitled "Ceramic Ferroelectric Composite Materials with Enhanced Electronic Properties BSTO Mg Based Compound-Rare Earth Oxide". These patents are incorporated herein by reference. The materials shown in these patents, especially BSTO-MgO composites, show low dielectric loss and high tunability. Tunability is defined as the fractional change in the dielectric constant with applied voltage.

Barium strontium titanate of the formula BaxSr1-xTiO3 is a preferred electronically tunable dielectric material due to its favorable tuning characteristics, low Curie temperatures and low microwave loss properties. In the formula BaxSr1-xTiO3, x can be any value from 0 to 1, preferably from about 0.15 to about 0.6. More preferably, x is from 0.3 to 0.6.

Other electronically tunable dielectric materials may be used partially or entirely in place of barium strontium titanate. An example is BaxCa1-xTiO3, where x is in a range from about 0.2 to about 0.8, preferably from about 0.4 to about 0.6. Additional electronically tunable ferroelectrics include PbxZr1-xTiO3 (PZT) where x ranges from about 0.0 to about 1.0, PbxZrlxSrTiO3 where x ranges from about 0.05 to about 0.4, KTaxNb1-xO3 where x ranges from about 0.0 to about 1.0, lead lanthanum zirconium titanate (PLZT), PbTiO3, BaCaZrTiO3, NaNO3, KNbO3, LiNbO3, LiTaO3, PbNb2O6, PbTa2O6, KSr(NbO3) and NaBa2(NbO3)5 KH2PO4, and mixtures and compositions thereof. Also, these materials can be combined with low loss dielectric materials, such as magnesium oxide (MgO), aluminum oxide (Al2O3), and zirconium oxide (ZrO2), and/or with additional doping elements, such as manganese (MN), iron (Fe), and tungsten (W), or with other alkali earth metal oxides (Le. calcium oxide, etc.), transition metal oxides, silicates, niobates, tantalates, aluminates, zirconnates, and titanates to further reduce the dielectric loss.

In addition, the following U.S. patent applications, assigned to the assignee of this application, disclose additional examples of tunable dielectric materials: U.S. application Ser. No. 09/594,837 filed Jun. 15, 2000, entitled "Electronically Tunable Ceramic Materials" Including Tunable Dielectric and Metal Silicate Phases"; U.S. application Ser. No. 09/768,690 filed Jan. 24, 2001, entitled "Electronically Tunable, Low-Loss Ceramic Materials Including a Tunable Dielectric Phase and Multiple Metal Oxide Phases"; U.S. application Ser. No. 09/882,605 filed Jun. 15, 2001, entitled "Electronically Tunable Dielectric Composite Thick Films And Methods Of Making Same"; U.S. application Ser. No. 09/834,327 filed Apr. 13, 2001, entitled "Strain-Relieved Tunable Dielectric Thin Films"; and U.S. Provisional Application Ser. No. 60/295,046 filed Jun. 1, 2001 entitled "Tunable Dielectric Compositions Including Low Loss Glass Frits". These patent applications are incorporated herein by reference.

The tunable dielectric materials can also be combined with one or more nontunable dielectric materials. The non-tunable phase(s) may include MgO, MgAl2O4, MgTiO3, Mg2SiO4, CaSiO3, MgSrZrTiO6, CaTiO3, Al2O3, SiO2 and/or other metal silicates such as BaSiO3 and SrSiO3. The non-tunable dielectric phases may be any combination of the above, e.g., MgO combined with MgTiO3, MgO combined with MgSrZrTiO6, MgO combined with Mg2SiO4, MgO combined with Mg2SiO4, Mg2SiO4 combined with CaTiO3 and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include CaZrO3, BaZrO3, SrZrO3, BaSnO3, CaSnO3, MgSnO3, Bi2O3/2SnO2, Nd2O3, Pr7O11, Yb2O3, HO2O3, La2O3, MgNb2O6, SrNb2O6, BaNb2O6, MgTa2O6, BaTa2O6 and Ta2O3.

Thick films of tunable dielectric composites may comprise Ba1-xSrxTiO3, where x is from 0.3 to 0.7 in combination with at least one non-tunable dielectric phase selected from MgO, MgTiO3, MgZrO3, MgSrZrTiO6, Mg2SiO4, CaSiO3, MgAl2O4, CaTiO3, Al2O3, SiO2, BaSiO3 and SrSiO3. These compositions can be BSTO and one of these components, or two or more of these components in quantities from 0.25 weight percent to 80 weight percent with BSTO weight ratios of 99.75 weight percent to 20 weight percent.

The electronically tunable materials may also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include Mg2SiO4, CaSiO3, BaSiO3 and SrSiO3. In addition to Group 2A metals, the present metal silicates may include metals from Group 1A, i.e., Li, Na, K, Rb, Cs and Fr, preferably Li, Na and K. For example, such metal silicates may include sodium silicates such as Na2SiO3 and NaSiO3-5H2O, and lithium-containing silicates such as LiAlSiO4, Li2SiO3 and Li4SiO4. Metals from Groups 3A, 4A and some transition metals of the Periodic Table may also be suitable constituents of the metal silicate phase. Additional metal silicates may include Al2Si2O7, ZrSiO4, KalSi3O8, NaAlSi3O8, CaAl2Si2O8, CaMgSi2O6, BaTiSi3O9 and Zn2SiO4. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include Mg2SiO4, MgO, CaTiO3, MgZrSrTiO6, MgTiO3, MgAl2O4, WO3, SnTiO4, ZrTiO4, CaSiO3, CaSnO3, CaWO4, CaZrO3, MgTa2O6, MgZrO3, MnO2, PbO, Bi2O3 and La2O3. Particularly preferred additional metal oxides include Mg2SiO4, MgO, CaTiO3, MgZrSrTiO6, MgTiO3, MgAl2O4, MgTa2O6 and MgZrO3.

The additional metal oxide phases are typically present in total amounts of from about 1 to about 80 weight percent of the material, preferably from about 3 to about 65 weight percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to 80 weight percent are typically used, smaller additive amounts of from 0.01 to 1 weight percent may be used for some applications.

The additional metal oxide phases can include at least two Mg-containing compounds. In addition to the multiple Mg-containing compounds, the material may optionally include Mg-free compounds, for example, oxides of metals selected from Si, Ca, Zr, Ti, Al and/or rare earths. The matching network elements 10a, 10c may be connected to matching network element 10b by means of line 106 and line 107.

These lumped components in the matching network 10 are ideally suited for integrated impedance matching at low GHz frequencies. This type of matching network 10 may be further preferred because it may comprises passive components such as inductors and metal-BST or dielectric-metal capacitors with high quality factors not generating noise or loss as with resistive networks. It is understood that the present invention is not limited to the aforementioned passive components.

The signal collecting means used in FIG. 3 may be directional couplers 101 and 102. These may be passive 3 or 4 port devices used to sample a portion of the forward (incident) signal or the reverse (reflected) signal, or both (dual directional coupler) in a RF, microwave circuit. Other types of couplers may be used as sampling means, such as branch line couplers, or a simple transmission line coupler and the present invention is not limited to any particular type of coupler. In an embodiment of the present invention, a transmission line coupler may be composed of two transmission lines that allow signals to be coupled or transferred in part from one line to the other.

The purpose of the coupler 102 may be to sample the incoming (mismatched) signals in one direction by means of line 110 and on reverse direction in line 109. In order to maximize coupling efficiency and to increase coupling field, two coupling ports may be used 109 and 110. There is transfer the RF energy from signal 104 to line 106 to the coupling means of ports 110 and 109 into the control and power control & logic unit (PC LU) 116 which converts the input analog signals 104 into digital signals, senses VSWR phase and magnitude, processes the digital signals using an algorithm and gives it a voltage value. These values may be compared to values coming from coupler 101 through coupling ports 105 and 108 into the logic and power control & logic unit (PC LU) 116. Once compared and matched, these values may later be fed through a connection means 118 into a Hi Voltage Application Specific Integrated Circuit (HV ASIC) 117 by which further transfers and distributes the compensatory voltages to the matching network elements 10a, 10b and 10c.

In an antenna, the impedance is the ratio of the applied or induced voltage to the current flowing into or out of the antenna input. More generally, it is defined as the ratio of the electric field to the magnetic field. The purpose of using variable matching capacitors 313 as matching network elements 10a, 10b and 10c is to compensate the mismatched impedances in the RF circuit by means of dynamically increasing or decreasing the voltage across said BST capacitors. The capacitance may be used to "tune" the RF circuit with an externally applied variable voltage 34. The algorithms in the power control & logic unit (PCLU) 116 may be based on dynamic equations (independent equations) for the purpose of control. Voltage compensation operations applied to the matching network elements 10a, 10b, and 10c, may be employed in a closed loop control system. This means will counteract dynamic lags or to modify the impedance between measured voltage of coupler 101 and coupler 102. Variables in the power control & logic unit (PCLU) 116 produces a prompt stable response voltage to output ports 111, 112, 113 from the HV ASIC 117. The compensation action may be conditioned by speed of the power control & logic unit (PCLU) 116 and the frequency of the incoming signals 104 and 103. In an embodiment of the present invention the variable capacitance of matching network elements 10a, 10b and 10c may allow for a simple low loss means to dynamically compensate any RF circuit in an autonomous system loop.

Figure 4:
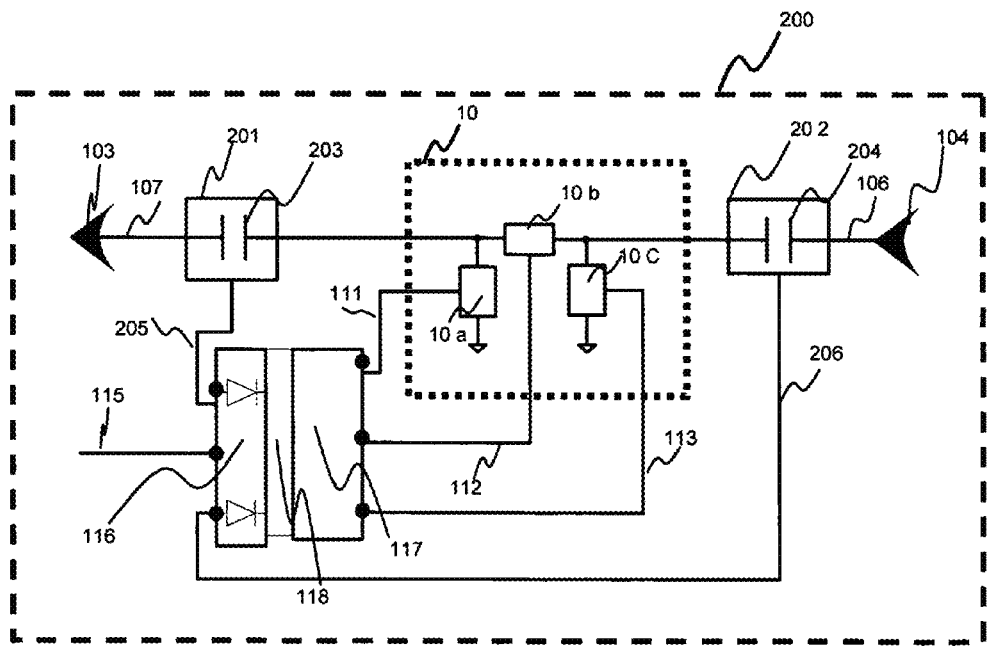
FIG. 4 is a schematical representation of one embodiment of the present invention, depicting the use of a "PP" network as the means for the matching network.

According to another embodiment of the present invention as illustrated in FIG. 4 is a dynamic impedance matching network system 200 that is composed of a "Pi" network as the means for the matching network 10. The "Pi" type network may comprise matching network elements 10a, 10b, 10c in which in an embodiment of the present invention (and not limited in this respect) to BST type variable matching capacitors 313 (as described in FIG. 1). The matching network elements 10a, 10c may be connected to matching network element 10b by means of line 106 and line 107. These lumped components in matching network 10 are ideally suited for integrated impedance matching at low GHz frequencies. This type of matching network 10 in an embodiment of the present invention may comprise passive components such as inductors and metal-BST or dielectric-metal capacitors with high quality factors not generating noise or loss as with resistive networks.

The signal sampler used in FIG. 4 may comprise sampling capacitors 204 and 203 and may be advantageously used as low impedance capacitor sampling elements 201, 202. These may be passive devices used to sample the voltage drop of a portion of the forward (incident) signal or the reverse (reflected) signal, or both in a RF, microwave circuit at any two points in the transmission line. The sampling capacitors 204 and 203 may be used to estimate coupling between two circuit points to make sure a minimum of coupling is obtained. Capacitance is dependent on conductor geometry, conductor spatial relationships, and the material properties surrounding the conductors. Capacitors are usually constructed as two metal surfaces separated by a nonconducting material. Printed capacitors form very convenient and inexpensive small capacitance values because they are printed directly on the printed circuit board (PCB) or substrate. For most applications, the higher the unloaded Q the better the capacitor. Gap capacitors are best used for very weak coupling and signal sampling because they are not particularly high Q. Air capacitors are fixed capacitors in which air is the dielectric material between the capacitor's plates. It is understood that the present invention is not limited to any particular type or number of capacitors.

As an alternative means, interdigital capacitors may be used as sampling capacitors 204 and 203. These are a planar version of the multilayer capacitor. These capacitors have medium Q, are accurate, and are typically less than 1 pF and may be tuned by cutting off fingers. Because interdigital capacitors have a distributed transmission line structure, they will show multiple resonances as frequency increases. The first resonance occurs when the structure is a quarter wavelength. The Q of this structure is limited by the current crowding at the thin edges of the fingers.

As a further alternative means, metal-insulator-metal (MIM) capacitor may be used as sampling capacitors 204 and 203. A MIM capacitor, which has a thin insulator layer between two metal electrodes and generally this capacitor is fabricated in semiconductor process, and this insulator layer provides high capacitance. Two extreme behaviors of a capacitor are that it will act as an open circuit to low frequencies or DC (zero frequency), and as a short frequency at a sufficiently high frequency (how high is determined by the capacitor value).

The signal sampling means used in FIG. 4 may be accomplished by measuring the voltage from the sampling capacitors 204 and 203. The low impedance capacitor sampling 5 elements 201, 202 provide the step voltage source. The voltages are the RMS values of the "vector sum of the incident and reflected waves. As the source voltage varies, the instantaneous value of voltage between the lines 106, 107 travels down the lines 206 and 205. The ratio of the traveling voltage wave 104 to the traveling current wave 103 is the characteristic impedance of the transmission line. If the terminating impedance is equal to the line characteristic impedance, there is no wave reflected back toward the generator; however, if the termination resistance is any value other than Zo there is a reflected wave. If RL is a real impedance and greater than Zo, the reflected wave is 180° out of phase with the incident wave. If RL is a real impedance and is less than Zo, the reflected wave is in phase with the incident wave. The amount of variation of RL from Zo determines the magnitude of the reflected wave. If the termination is complex, the phase of the reflected wave is neither zero nor 180°. Sampling the voltage at any point along the transmission line will yield the vector sum of the incident and reflected waves.

The sampling process is the act of turning a time continuous signal into a signal that is time discrete or time-discontinuous. In order to maintain frequency components of interest in the time-discontinuous signal, the Nyquist sampling criterion is satisfied. This criterion states that the rate of sampling of the time-continuous signal has to be at least twice as great as the frequency of the signal component with the highest frequency which is of interest in the time-continuous signal. A control loop can uniform supply the sampling of a continuous signal at a constant sampling frequency.

Figure 5:
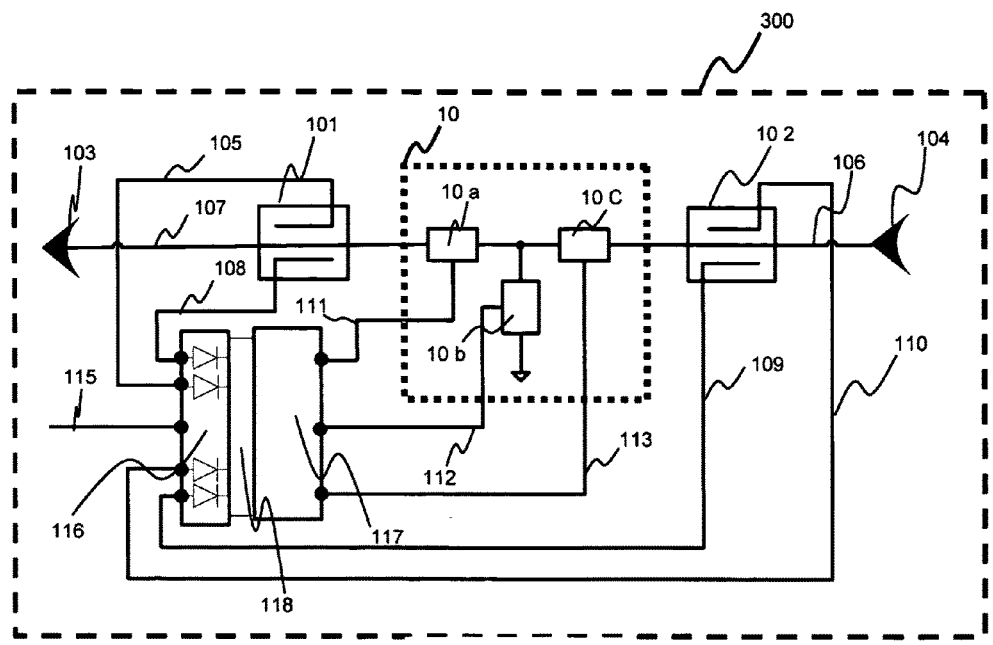
FIG. 5 is a schematical representation of one embodiment of the present invention depicting the use of a "T" network as the means for the matching network.

According to an embodiment of the present invention, FIG. 5 depicts a dynamic impedance matching network system 300 that is composed of a "T" network as the means for the matching network 10. The representation includes the matching network elements 10a, 10b and 10c. A "ladder" network may be use as means for the matching network 10; this is the connection of coils and contacts used in a control circuit shown in FIG. 7 one line after another that resembles. The "ladder" type circuit in FIG. 7 may comprise, but is not limited to, four inductors in series 301, 302, 303, and 304. It further may include three grounded matching capacitors in parallel 305, 306 and 307 connected to said inductors. The matching capacitors may be of BST type capacitors (as described in FIG. 1). These lumped components are ideally suited for integrated impedance matching at low GHz frequencies. This type of matching network is further preferred because it may be composed of passive components such as inductors and metal-BST dielectric-metal capacitors with high quality factors not generating noise or loss as with resistive networks. The signal collecting means used in FIG. 5 are directional couplers 101 and 102. These are passive 3 or 4 port devices used to sample a portion of the forward (incident) signal or the reverse (reflected) signal, or both (dual directional coupler) in a RF, microwave circuit.

The purpose of the coupler 102 is to sample the incoming (mismatched) signals in one direction by means of line 110 and on reverse direction in line 109. In order to maximize coupling efficiency and to increase coupling field, two coupling ports 109 and 110 are used. There is a transfer of RF energy from signal 104 to line 106 to the coupling means of ports 110 and 109 into the control and power control & logic unit (PC LU) 116 which converts the input analog signals 104 into digital signals, senses VSWR phase and magnitude, processes the digital signals using an algorithm and gives it a voltage value. These values are compared to values coming from coupler 101 though coupling ports 105 and 108 into the logic and power control & 5 logic unit (PC LU) 116. Once compared and matched, these values are later fed through a connection means 118 into a Hi Voltage Application Specific Integrated Circuit (HV ASIC) 117 by which further transfers and distributes the compensatory voltages to the matching network elements 10a, 10b and 10c.

Figure 6:
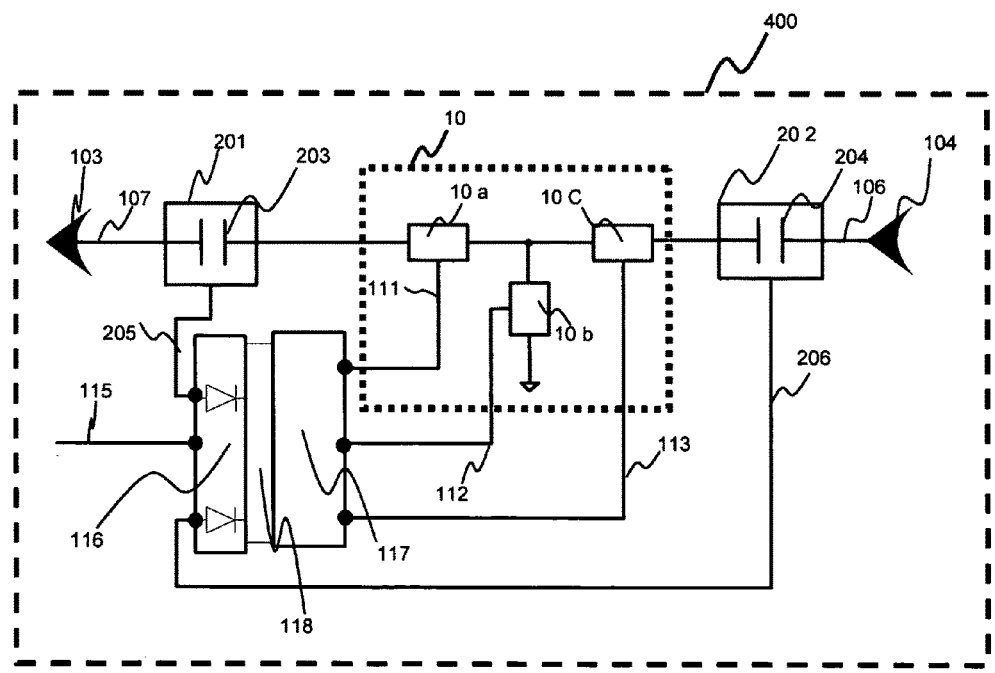
FIG. 6 is a schematical representation of one embodiment of the present invention depicting the use of a "T" network as the means for the matching network.

According to a fourth advantageous embodiment, FIG. 6 depicts a dynamic impedance matching network system 400 that may comprise of a "T" network as the means for the matching network 10. The representation includes the matching network elements 10a, 10b and 10c. In an embodiment of the present invention, the signal sampling means used in FIG. 6 comprises sampling capacitors 204 and 203 and may use as low impedance capacitor sampling elements 201, 202. These are passive devices used to sample the voltage drop of a portion of the forward (incident) signal or the reverse (reflected) signal, or both in a RF, microwave circuit at any two points in the transmission line. The sampling capacitors 204 and 203 are used to estimate coupling between two circuit points to make sure a minimum of coupling is obtained.

Figure 11:
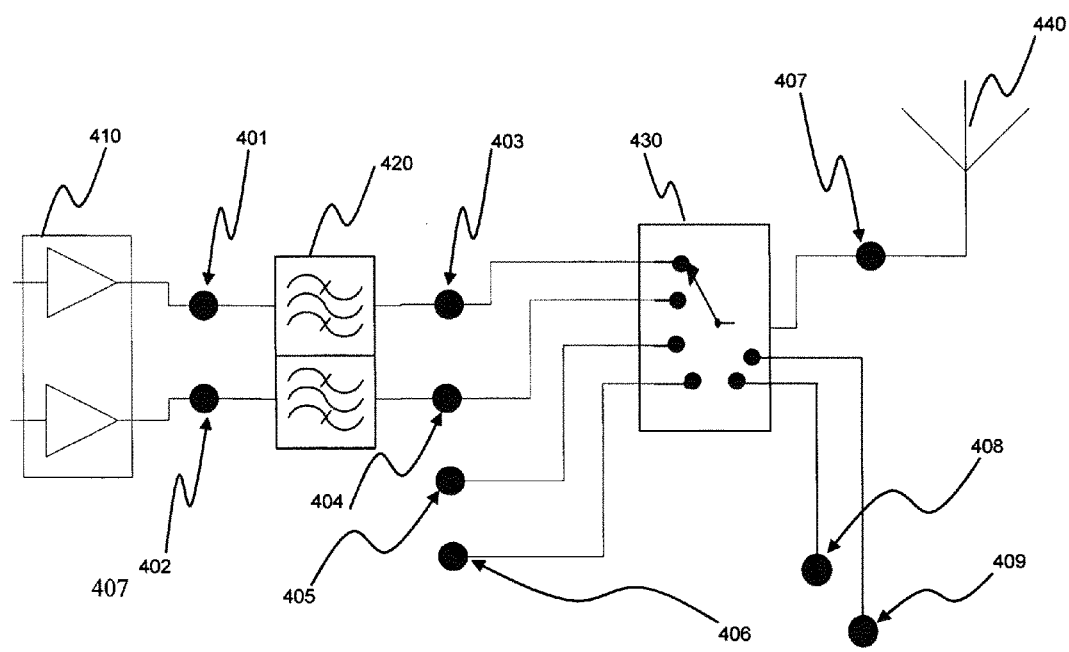
FIG. 11 is a graphical block representation of the invention as it is used as part of a multi-band Radio Frequency (RF) system in one embodiment of the present invention.

In an embodiment of the present invention, the dynamic impedance matching network systems 100, 200, 300 and 400, may be single stand-alone components (modules), that may be placed in the transmit chain of mobile phone radio FIG. 11. The dynamic impedance matching network systems 100, 200, 300 and 400 are advantageously self-contained, requiring only a fixed DC bias 3V from the mobile phone. The main purpose of the dynamic impedance matching network system 300 is to monitor the mismatch at port 104 and dynamically change the RF match or transfer function to maximize power transfer and minimize power lost due to reflection into a mismatch anywhere in the RF electronic device.

The self contained dynamic impedance matching network systems of embodiments of the present invention may be mounted onto a low-cost thermally conductive dielectric substrate such as Alumina (Al2O3) with the said components surface mounted on one side, then over-molded as a Multi-Chip-Module (MCM) of a typical size of 10-15 mm2 size, which is itself surface mountable on to the printed wiring board (PWB) of the RF devise. It is understood that the present invention is not limited to any particular dielectric substrates. The dynamic impedance matching network systems may further comprise at least one DC input port 115, at least one RF output port 109 and at least one RF input port 125 (multiple ports may be used for each band). Generally, GaAs MESFET processes are utilized; on semi-insulating substrate and thick metallization layers, although the present invention is not limited in this respect. This process allows passive matching components such as spiral inductors and variable matching capacitors 313 and metal-insulator-metal (MIM) 305,306 and 307 capacitors with high quality factors. Fully integrated matching network elements 10a, 10b and 10c using spiral inductors and variable matching capacitors 313 may be done on-chip in order to improve the reproducibility and save board space, although it is not required to be. These lumped passive components may be ideally suited for integrated impedance matching at low GHz frequencies.

The self-contained dynamic impedance matching network systems 100, 200, 300 and 400, may be advantageously used between any two units or components in any system with a varying impedance match issue. In an embodiment of FIG. 11 is a band Radio Frequency (RF) system that depicts the multiple locations 401, 401, 403, 404 and 407 between the elements in the system. The self-contained dynamic impedance matching network system may be advantageously positioned at 401 and 402 between a Power Amplifier (PA) unit 410 and a frequency filter unit 420. The external digital signal processor of the mobile phone may also be used as an alternative to the power control & logic unit (PC LU) 116 and the Hi Voltage Application Specific Integrated Circuit (HV ASIC) 117. The PA's in the 410 unit, the filters in the 420 unit, switches in the 430 unit and antennas 440, all may have variations in performance and impedance (unit-to-unit variations) are matched once the dynamic impedance matching network system is in line. The dynamic impedance matching network system may also be advantageously placed at 403 and 404 in between a frequency filter unit 420 and a switch unit 430. The dynamic impedance matching network system may also be advantageously placed at 407 between a switch unit 430 and an antenna 440. The dynamic impedance matching network system may also be advantageously placed at any of the inputs and outputs of the switch unit 430 a for example and not by way of limitation: TxLo 403, TxHi 404, RxLI 408, Rx L2 409, TxH1 405 and TxH2 406.

Change in optimum impedance is required when operating under different protocols for multi-mode phones. Using this type of self-contained dynamic impedance matching network system there are no specific signals needed from the baseband or receiver, making it possible to be universal in nature, working in any RF devise regardless of protocol. This same self-contained dynamic impedance matching network system works equally well in a GSM, EDGE, CDMA or WCDMA phone, or even multi-mode phone. The dynamic impedance matching network system will be at least capable of a single band operation, this includes but it is not limited to; 800, 900, 1800, 1900 MHz bands and the 2.1 GHz band.

The PA's in the 410 unit may be made of Gallium Arsenide (GaAs)/Heterojunction Bipolar Transistor (HBT), although the present invention is not limited in this respect. In a multiple band module such as in FIG. 11, in order to compensate to optimum impedance at different power levels (whether the PA's in the 410 unit are saturated or linear in operation), the preferred position of the dynamic impedance matching network system may be at the final stage of the unit at positions 401 and 402. The performances in each of the 2 bands (Hi and Low) are "stretched" to cover the 2 sub-bands; the self-contained dynamic impedance matching network system compensated the PA's output and reduced the VSWR from a 10:1 to 3:1.

Figure 12:
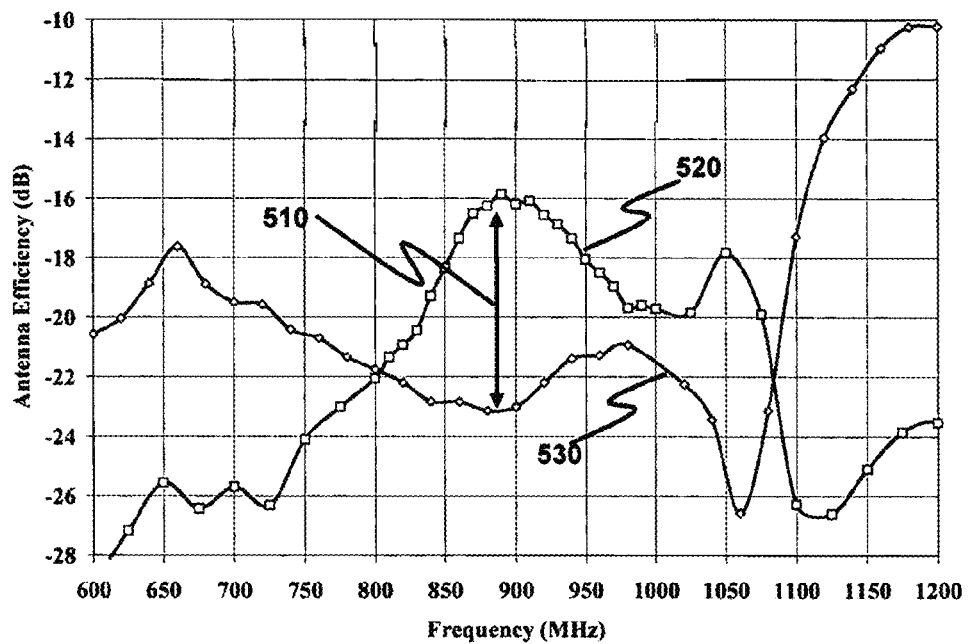
FIG. 12 provides a table of data collected from measurements of a RF cellular phone placed on a first test environment.

When positioned at 407 in FIG. 11 in a GSM band mobile phone, the results are shown in the table of FIG. 12. The TABLE of FIG. 12 provides a graphical representation of data collected from measurements of a RF cellular phone placed on a first test environment. The test environment consisted of the phone placed in the pant pocket of a human being sitting on a metal chair. Both return loss and efficiency was compared to an OEM matching network. The data was plotted in the abscissa of the x plane the frequency in MHz vs. the y axis the antenna efficiency in dB. The self-contained dynamic impedance matching network system 100 was tuned to optimize return loss at 900 MHz. Curve 530 depicts the factory matching network and curve 520 depicts when the disclosed invention replaces the factory matching network. The arrow 510 depicts an improvement of >6 dB in efficiency, which means a 2×-3× gained by incorporating the disclosed invention into the phone circuit.

Figure 13:
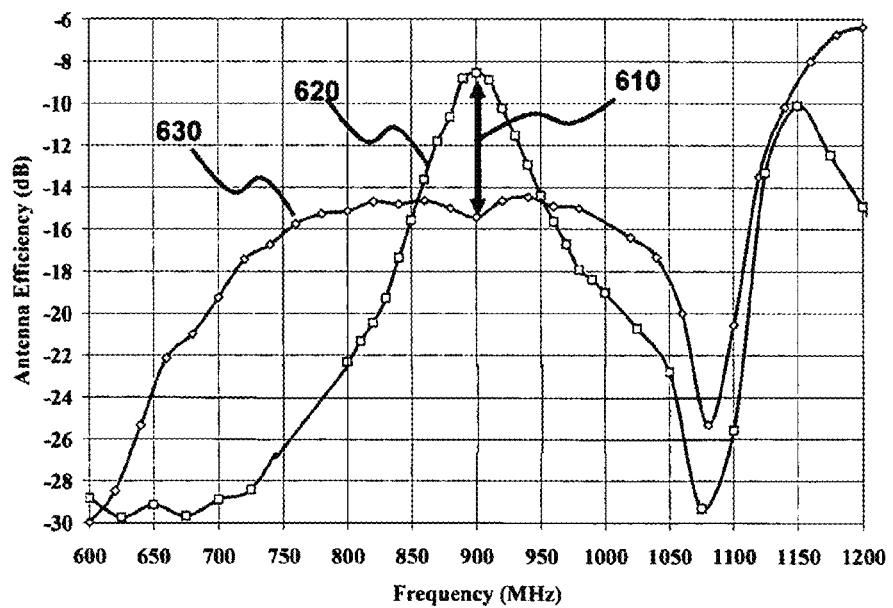
FIG. 13 provides a table of data collected from measurements of a RF cellular phone placed on a second test environment.

The TABLE of FIG. 13 is a graphical representation of data collected from measurements of a RF cellular phone placed on a second test environment. The test environment consisted of the phone placed faced up on a metal surface with the flip cover open. Both return loss and efficiency was compared to the OEM matching network. The data was plotted in the abscissa of the x plane the frequency in MHz vs. the y axis the antenna efficiency in dB. The self-contained dynamic impedance matching network system 100 was tuned to optimize return loss at 900 MHz. Curve 630 depicts the factory matching network and curve 620 depicts when the disclosed invention replaces the factory matching network. The arrow 610 depicts an improvement of >6 dB in efficiency, which means a 2×-3× gained by incorporating the disclosed invention into the phone circuit.

The experiments showed a significant improvement by maximizing power transfer and reducing mismatch losses caused by component impedance variations. Impedance variations of all components in the transmitter chain caused by temperature variations, aging or radiation hot spots caused by VSWR problems within the phone, resulting in radiation leaking around the display and into the user's body or hand. The experiments also showed that the closer the dynamic impedance matching network system 100 was to the antenna 440, the larger the effect and the greater the ability to control the impedance match. Furthermore, a significant decrease in specific absorption rate (SAR) was seen, improving the transmitter chain match reduced much of the radiation that was measured during SAR testing.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. A variable impedance circuit, comprising:
    a matching network to couple to a tunable device;
    wherein the matching network comprises a first port and a second port;
    wherein the tunable device is coupled to one of the first port or the second port;
    wherein the matching network comprises one or more variable dielectric capacitors;
    wherein the one or more variable dielectric capacitors are operable to receive a first of one or more variable voltage signals to cause the one or more variable dielectric capacitors to change a first impedance of the matching network;
    wherein the tunable device is operable to receive a second of one or more variable voltage signals to cause a change in a second impedance of the tunable device; and
    wherein at least one of the one or more variable dielectric capacitors comprises:
        a first conductor coupled to one of the first port or the second port;
        a second conductor; and
        a tunable dielectric material positioned between the first conductor and the second conductor, wherein at least one of the first conductor or the second conductor, or both are adapted to receive the first of the one or more variable voltage signals to cause the change in the first impedance of the matching network.

2. The variable impedance circuit of claim 1, wherein the change in the first impedance of the matching network causes an increase in power transferred from the first port to the second port or from the second port to the first port.

3. The variable impedance circuit of claim 1, wherein the change in the second impedance of the tunable device causes an increase in power transferred from the first port to the second port or from the second port to the first port.

4. The variable impedance circuit of claim 1, wherein the tunable dielectric material comprises a composition of barium strontium titanate.

5. The variable impedance circuit of claim 1, wherein the tunable device comprises a second tunable dielectric material.

6. The variable impedance circuit of claim 5, wherein the second of the one or more variable voltages is coupled to the second tunable dielectric material to cause the change in the second impedance of the tunable device.

7. The variable impedance circuit of claim 1, wherein the tunable device is a tunable antenna.

8. A variable impedance circuit, comprising:
a matching network to couple to an antenna, wherein the antenna comprises an antenna component that makes the antenna tunable;
wherein the matching network comprises a first port and a second port;
wherein the antenna is coupled to one of the first port or the second port;
wherein the matching network comprises one or more variable reactive components;
wherein the one or more variable reactive components are operable to receive a first of one or more variable voltage signals to cause the one or more variable reactive components to change a first impedance of the matching network;
wherein the component of the antenna is operable to receive a second of one or more variable voltage signals to cause the component to change a second impedance of the antenna;
wherein at least one of the one or more variable reactive components comprises:
a first conductor coupled to one of the first port or the second port;
a second conductor; and
a tunable dielectric material positioned between the first conductor and the second conductor, wherein at least one of the first conductor or the second conductor, or both are adapted to receive the first of the one or more variable voltage signals to cause the change in the first impedance of the matching network.

9. The variable impedance circuit of claim 8, wherein at least one of the change in the first impedance of the matching network, or the change in the second impedance of the antenna, or both causes a change in power transferred from the first port to the second port or from the second port to the first port.

10. The variable impedance circuit of claim 8, wherein each of the one or more variable reactive components comprises one or more variable capacitors.

11. The variable impedance circuit of claim 8, wherein the tunable dielectric material comprises a composition of barium strontium titanate.

12. The variable impedance circuit of claim 8, wherein the antenna component comprises a second tunable dielectric material.

13. The variable impedance circuit of claim 12, wherein the second of the one or more variable voltages is coupled to the second tunable dielectric material to cause the change in the second impedance of the antenna.

14. The variable impedance circuit of claim 8, wherein at least one of the one or more variable reactive components comprises the tunable dielectric material.

15. The variable impedance circuit of claim 14, wherein the tunable dielectric material comprises a composition of barium strontium titanate.

16. A variable impedance circuit, comprising:
an antenna comprising a tunable component;
wherein the tunable component is operable to receive a variable signal to cause the tunable component to change an impedance of the antenna; and
wherein the tunable component comprises:
a first conductor coupled to the antenna;
a second conductor; and
a tunable material positioned between the first conductor and the second conductor, wherein at least one of the first conductor or the second conductor, or both are adapted to receive the variable signal to cause the change in the impedance of the antenna.

17. The variable impedance circuit of claim 16, wherein the change in the impedance of the antenna causes a change in power transferred by the antenna.

18. The variable impedance circuit of claim 16, wherein the tunable material comprises a tunable dielectric material.

19. The variable impedance circuit of claim 18, wherein the tunable dielectric material comprises a composition of barium strontium titanate.

20. The variable impedance circuit of claim 16, wherein the tunable material comprises a composition of barium strontium titanate.

* * * * *